United States Patent
Aoyama

(10) Patent No.: US 6,909,156 B2
(45) Date of Patent: Jun. 21, 2005

(54) SEMICONDUCTOR DEVICE AND MANUFACTURING METHOD THEREFOR

(75) Inventor: Tomonori Aoyama, Ibaraki (JP)

(73) Assignee: Abushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/811,056

(22) Filed: Mar. 29, 2004

(65) Prior Publication Data
US 2004/0188778 A1 Sep. 30, 2004

(30) Foreign Application Priority Data
Mar. 31, 2003 (JP) .................................. 2003-093989

(51) Int. Cl.[7] .................. H01L 29/76; H01L 29/94; H01L 31/062; H01L 31/113; H01L 31/119
(52) U.S. Cl. .................. 257/410; 257/368; 257/382
(58) Field of Search .................. 257/368, 382–410

(56) References Cited

U.S. PATENT DOCUMENTS

| | | | |
|---|---|---|---|
| 5,254,506 A | 10/1993 | Hori | |
| 5,874,766 A | 2/1999 | Hori | |
| 6,013,553 A | 1/2000 | Wallace et al. | |
| 6,020,024 A | 2/2000 | Maiti et al. | |
| 6,020,243 A | 2/2000 | Wallace et al. | |
| 6,291,867 B1 | 9/2001 | Wallace et al. | |
| 6,613,658 B2 | 9/2003 | Koyama et al. | |
| 2001/0023120 A1 | 9/2001 | Tsunashima et al. | |
| 2002/0158250 A1 | 10/2002 | Fujisaki et al. | |

FOREIGN PATENT DOCUMENTS

| | | |
|---|---|---|
| JP | 5-214339 | 8/1993 |
| JP | 7-176504 | 7/1995 |
| JP | 11-97434 | 4/1999 |
| JP | 2001-332547 | 11/2001 |
| JP | 2002-270596 | 9/2002 |
| JP | 2002-299607 | 10/2002 |
| JP | 2002-305196 | 10/2002 |
| JP | 2002-324901 | 11/2002 |

Primary Examiner—Cuong Nguyen
(74) Attorney, Agent, or Firm—Leydig, Voit & Mayer, Ltd.

(57) ABSTRACT

A semiconductor device includes a first insulating film on a silicon substrate and a second insulating film on the first insulating film. The first insulating film is a silicon oxide film having a thickness of 1 nm or less and a suboxide content of 30% or less. The second insulating film is a high dielectric constant insulating film.

11 Claims, 9 Drawing Sheets

SEMICONDUCTOR DEVICE AND MANUFACTURING METHOD THEREFOR

Background of the Invention

1. Field of the Invention

The present invention relates to a semiconductor device and a manufacturing method therefor, and more particularly to a semiconductor device including a high dielectric constant insulating film and a manufacturing method therefor.

2. Background Art

In recent years, the integration density of semiconductor integrated circuit devices has considerably increased. As such, devices such as transistors for MOS (Metal Oxide Semiconductor) devices, for example, have been miniaturized and enhanced in performance. Especially, the gate insulating films, which are a component of the MOS structure, have become thinner and thinner to accommodate the miniaturization, higher-speed operation, and lower-voltage operation of the transistors.

Conventionally, silicon oxide films and silicon oxynitride films have been used for gate insulating films. However, reducing the film thickness of gate insulating films of such materials (considerably) increases the leakage current.

On the other hand, CMOS (Complementary Metal Oxide Semiconductor) devices of a sub-0.1 µm generation must employ gate insulating films having an equivalent oxide thickness of 1.5 nm or less. Therefore, it is proposed that metal oxide films or metal silicate films, which have a high relative permittivity, may be used as the gate insulating films to provide an increased film thickness and thereby reduce the leakage current.

However, when a metal oxide film or a metal silicate film is directly formed on a silicon substrate, the surface of the silicon substrate is oxidized due to heat treatment during or after the film forming process, resulting in formation of a silicon oxide film whose film thickness is as large as 1.5 nm or more. Therefore, it has been difficult to obtain an equivalent oxide thickness of 1.5 nm or less. Furthermore, there is another problem with this type of silicon oxide film. That is, the silicon in a univalent, bivalent, or trivalent state existing in the silicon oxide film bonds to oxygen, forming suboxides, which contain more silicon than the stoichiometric composition of silicon oxide, or silicon dioxide ($SiO_2$). This leads to an increased leakage current. To overcome this problem, a method is proposed for forming a silicon oxide film, a silicon nitride film, or a silicon oxynitride film on the silicon substrate as the underlying film before forming a metal oxide film or a metal silicate film (see, for example, Japanese Laid-Open Patent Publication No. 11-126902 (1999)).

When the silicon oxide film formed on the surface of the silicon substrate contains only a small amount of suboxide, the subsequent metal oxide film or metal silicate film forming process and the heat treatment process following it cause only a small increase in the film thickness of the silicon oxide film, providing relatively good leakage characteristics. With a laminated structure made up of a high dielectric constant insulating film and a silicon oxide film, however, it is necessary to control the film thickness of the silicon oxide film such that it is 1.0 nm or less, thereby the suboxides existing in the surface portion of the silicon substrate contribute more to an increase in the leakage current.

On the other hand, it is proposed that processes such as removal of the natural oxide film on the surface of the silicon substrate, formation of films, and monitoring of the formed films may be carried out in succession within a cluster tool under reduced pressure or filled with dry nitrogen (see, for example, Japanese Laid-Open Patent Publication No. 2002-270596). This arrangement is said to prevent a absorption of contaminants and water due to exposure to the atmosphere. According to the above Japanese Laid-Open Patent Publication No. 2002-270596, a silicon substrate is introduced into a precleaning chamber under reduced pressure in which the substrate is treated with dilute hydrofluoric acid. The silicon substrate is then washed with water and dried before it is transferred to a gate oxidation furnace after a re-evacuation process. However, since the moisture within the processing chamber is difficult to control, it is considered that it is difficult to produce a semiconductor device including a metal oxide film or a metal silicate film by the above method.

Further, conventionally, silicon nitride films, which have a higher relative permittivity than silicon oxide films, have been used as metal oxide film capacitors having a high dielectric constant. Recently, however, silicon oxynitride films are used as gate insulating films since forming a silicon nitride film in contact with a silicon substrate may increase the interfacial level (see, for example, Japanese Laid-Open Patent Publication No. 2-256274 (1980)).

When the surface of a silicon substrate is directly nitrided, first the natural oxide film existing in the surface of the silicon substrate and containing a large amount of suboxide is removed with an aqueous solution of dilute hydrofluoric acid. Then, a hydrogen termination process is carried out to prevent the surface of the silicon substrate from being oxidized again, before the surface is nitrided (see, for example, Japanese Laid-Open Patent Publication No. 2002-324902). However, it is difficult to hydrogen-terminate all silicon atoms present in the surface of the silicon substrate. Therefore, water and oxygen are absorbed to silicon atoms not terminated with hydrogen in the water washing/drying process after the dilute hydrofluoric acid treatment or in the transfer process to the nitriding equipment, forming suboxides of silicon. Because of this, the silicon nitride film, which has a film thickness of approximately 1 nm, has an oxygen concentration of 0.5 atom % or more.

Other documents also describe forming a silicon oxynitride film at the interface between the silicon substrate and the metal oxide film having a high dielectric constant (see, for example, Japanese Laid-Open Patent Publications Nos. 2001-257344, 2002-305196, and 2002-324901). These methods first form a silicon oxide film and then nitride the formed silicon oxide film in order to reduce the nitrogen concentration at the interface between the silicon substrate and the (resultant) silicon oxynitride film and thereby reduce the interfacial level. However, since they form one to three atomic layers of silicon oxide (film) and nitride them, the same problem as that described above in connection with formation of a silicon oxide film arises.

Furthermore, even if a high quality silicon oxide film, silicon nitride film, or silicon oxynitride film is used as the underlying film, an increase in the film thickness of the underlying film occurs when a high dielectric constant insulating film is formed thereon. Therefore, the film forming method must be capable of reducing the increase in the film thickness of the underlying film. When one of the above films is used as the underlying film, the high dielectric constant insulating film is preferably formed by a CVD (Chemical Vapor Deposition) technique rather than a sputtering technique, which inflicts larger damage to the underlying film, or other deposition techniques, which provide poorer surface uniformity. However, the CVD technique uses an oxidizing gas such as water molecules, oxygen molecules, oxygen radicals, or ozone, making it difficult to reduce the increase in the film thickness of the underlying film.

SUMMARY OF THE INVENTION

The present invention has been devised in view of the above problems. It is, therefore, an object of the present invention to provide a high-performance semiconductor device and a manufacturing method therefor wherein the method forms an insulating film having good interfacial characteristics to the silicon substrate, and then forms a high dielectric constant insulating film on the formed insulating film.

Other objects and advantages of the present invention will become apparent from the following description.

According to one aspect of the present invention, a semiconductor device comprises a first insulating film on a silicon substrate and a second insulating film on the first insulating film. The first insulating film is a silicon oxide film having a film thickness of 1 nm or less and a suboxide content of 30% or less. The second insulating film is a high dielectric constant insulating film.

According to another aspect of the present invention, a semiconductor device comprises a first insulating film on a silicon substrate and a second insulating film on the first insulating film. The first insulating film is a silicon oxynitride film having a film thickness of 1 nm or less and a suboxide content of 30% or less. The second insulating film is a high dielectric constant insulating film.

According to another aspect of the present invention, a semiconductor device comprises a first insulating film on a silicon substrate and a second insulating film on the first insulating film. The first insulating film is a silicon nitride film having a film thickness of 1 nm or less and an oxygen content of less than 0.1 atom %. The second insulating film is a high dielectric constant insulating film.

According to another aspect of the present invention, in a method for manufacturing a semiconductor device, a surface of a silicon substrate is treated with a non-oxidizing gas under reduced pressure. A first insulating film is formed on the silicon substrate while maintaining the reduced pressure. A metal oxide film is formed on the first insulating film using an oxygen containing material, the metal oxide film being a second insulating film. The metal oxide film is heat treated under an atmosphere of an oxidizing gas.

Other and further objects, features and advantages of the invention will appear more fully from the following description.

DETAILED DESCRIPTION OF THE PREFERRED EMBODIMENTS

Description will be made of semiconductor devices and manufacturing methods therefor according to preferred embodiments of the present invention with reference to FIGS. 1 to 7. It should be noted that in these figures, like numerals will be used to denote like components.

First Embodiment

Figure 1:
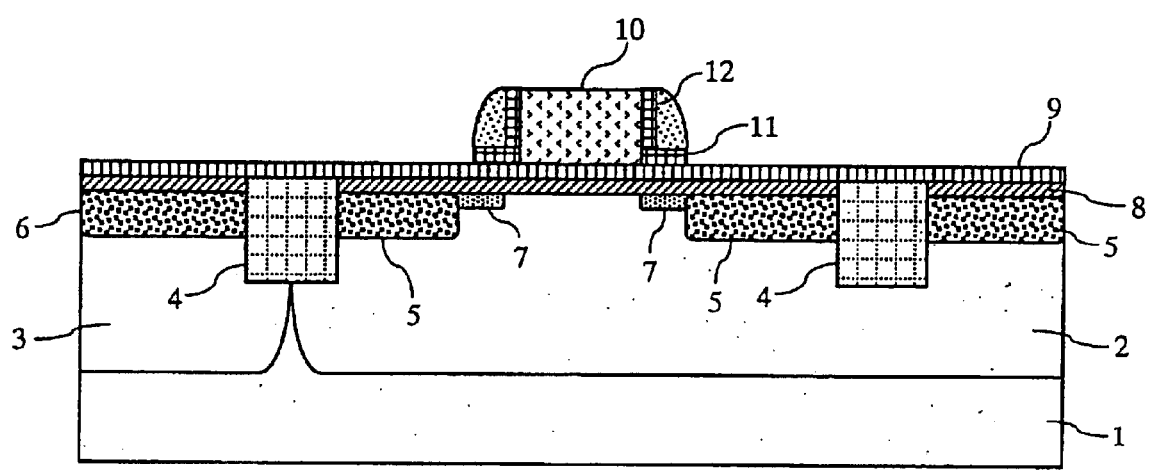
FIG. 1 is a cross-sectional view of the semiconductor device according to the first embodiment.

FIG. 1 is a cross-sectional view of a semiconductor device according to a first embodiment of the present invention.

As shown in FIG. 1, in a silicon substrate 1 are formed an N type diffusion layer 2, a P type diffusion layer 3, device separation regions 4, a P type source/drain diffusion layer 5, an N type source/drain diffusion layer 6, and P type extension regions 7. Furthermore, as a first insulating film, a silicon oxide film 8 is formed on the entire surface of the silicon substrate 1 except for the device separation regions 4. According to the present embodiment, the film thickness of the silicon oxide film 8 is set to 1 nm or less, and its suboxide content is set to 30% or less.

Further, a hafnium silicate film 9 is formed on the silicon oxide film 8 as a second insulating film, and a gate electrode 10 is formed on the hafnium silicate film 9. Still further, a silicon oxide film 11 and a silicon nitride film 12 are formed on the sidewalls of the gate electrode 10. It should be noted that according to the present invention, the first and second insulating films together constitute the gate insulating film.

According to the present embodiment, instead of the hafnium silicate film, another high-dielectric constant insulating film may be used (as the second insulating film). Examples of such films include zirconium silicate films, lanthanum silicate films, and yttrium silicate films. Alternatively, the second insulating film may be a metal silicate film of two or more metals selected from a group consisting of hafnium, zirconium, lanthanum, and yttrium. Further, it may be a metal oxide film of one or more metals selected from a group consisting of hafnium, zirconium, lanthanum, yttrium, and aluminum.

For example, if it is assumed that the film thickness of the silicon oxide film 8 is 0.5 nm, its suboxide content is 30%, and the film thickness of the hafnium silicate film 9 is 2.0 nm, then the equivalent oxide thickness (hereinafter referred to as EOT) is 1.2 nm.

The relative permittivity of a metal oxide film is usually higher than that of a metal silicate film. Therefore, when a metal oxide film is used as the high dielectric constant insulating film, the film thickness of the underlying silicon oxide film can be set larger than when a metal silicate film having the same film thickness is used as the high dielectric constant insulating film, assuming the same EOT value for both cases. On the other hand, a relatively large portion of the suboxide in the silicon oxide film exists around the interface to the silicon substrate. Therefore, for example, if a hafnium oxide film having a film thickness of 2.0 nm is used, the suboxide content of the silicon oxide film can be set to 20% or less.

Incidentally, if silicon doped with boron (B) is used for a gate electrode, reducing the film thickness of the gate insulating film causes the problem of the boron (B) penetrating through the film when it is heat treated. To overcome this problem, it is proposed to use a nitrogen containing metal oxide film or metal silicate film (see, for example, U.S.

Pat. No. 6,013,553 and Japanese Laid-Open Patent Publications Nos. 2001-257344, 2001-332547, 2002-299607, and 2002-314067). According to the present invention, a nitrogen containing hafnium silicate (hafnium silicon oxynitride) film may be used as the second insulating film. Another metal silicate film containing nitrogen may also be used instead. Examples of such metal silicon oxynitride films are zirconium silicate films, lanthanum silicon oxynitride films, and yttrium silicon oxynitride films. Alternatively, the second insulating film may be a metal silicate film of two or more metals selected from a group consisting of hafnium, zirconium, lanthanum, and yttrium. Further, it may be a metal oxide film of one or more metals selected from a group consisting of hafnium, zirconium, lanthanum, yttrium, and aluminum. Each of these films may contain nitrogen.

FIGS. 2A to 2F and FIGS. 3A to 3E are cross-sectional views illustrating a process of manufacturing the semiconductor device shown in FIG. 1.

Figure 2A:
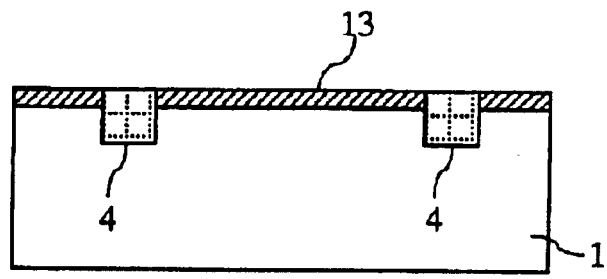
FIGS. 2A–2F are cross-sectional views showing a manufacturing process of the semiconductor device according to the first embodiment.

First of all, as shown in FIG. 2A, a silicon oxide film is buried in predetermined regions of the silicon substrate 1, forming the device separation regions 4 having an STI (Shallow Trench Isolation) structure and a sacrificial silicon oxide film 13.

Figure 2B:
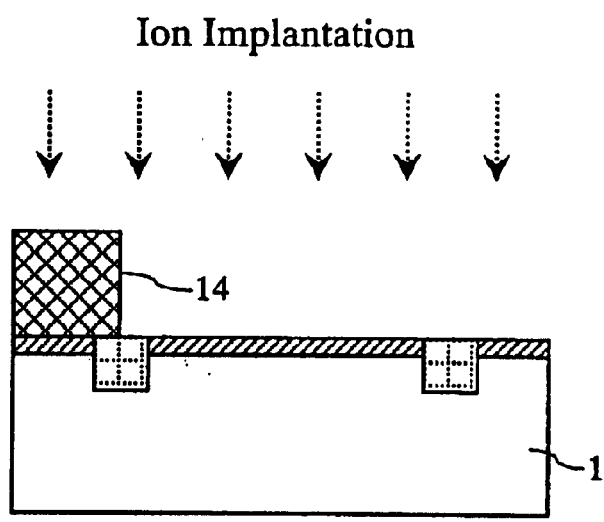

Then, a resist pattern 14 is formed in a predetermined region by a photolithographic technique, and phosphorous (P) is implanted into the silicon substrate 1 a plurality of times using the formed resist pattern 14 as a mask, as shown in FIG. 2B. It should be noted that the purpose of the P implantation is to form a diffusion layer and adjust the transistor threshold voltage.

Figure 2C:
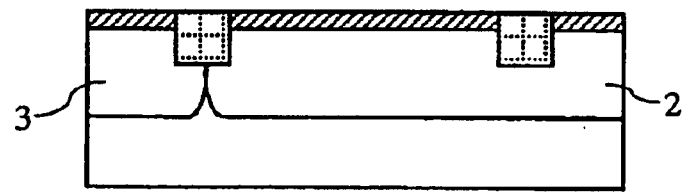

After completing the P implantation, the resist pattern 14 is removed since it is no longer necessary. Then, boron (B) is implanted in the silicon substrate in the same manner. After that, the implanted elements are diffused by heat treatment to form the N type diffusion layer 2 and the P type diffusion layer 3, as shown in FIG. 2C.

Then, the sacrificial silicon oxide film 13 is removed by use of an aqueous solution of ammonium fluoride ($NH_4F$). After that, the surface of the silicon substrate 1 is cleaned by use of an aqueous solution of approximately 0.5 to 5% dilute hydrofluoric acid. Immediately after the cleaning process, the silicon substrate 1 is placed in a reactor (not shown). The reactor is then evacuated to sufficiently remove oxygen and water from it. Subsequently, the temperature within the reactor is increased to between 25° C. and 600° C., and a non-oxidizing gas is introduced into it. At that time, the partial pressure of the non-oxidizing gas within the reactor is preferably set to 100 Pa or less.

The non-oxidizing gas may be, for example, a fluorine containing gas.

For example, after increasing the temperature within the reactor to 300° C., HF (hydrogen fluoride) gas is introduced into it. At that time, the partial pressure of the HF gas is set to approximately 10 Pa. Maintaining this state for 5 minutes can remove the natural silicon oxide film formed on the surface of the silicon substrate.

Examples of the fluorine containing gas include, in addition to HF gas, $ClF_3$ gas, $F_2$ gas, $NF_3$ gas, and a mixture thereof.

A further example of the fluorine containing gas is a mixed gas consisting of CO gas, $H_2$ gas, $CF_4$ gas, $SF_6$ gas, He gas, Ar gas, and $N_2$ gas. In this case, the temperature and the pressure are preferably set to 250° C. or more and 1 Pa or less, respectively. The natural oxide film can be removed by the reduction action of the CO gas and $H_2$ gas. Furthermore, the oxygen absorbed to the silicon substrate 1 can be removed by the $CF_4$ gas, $SF_6$ gas, He gas, Ar gas, and $N_2$ gas. It should be noted that the higher the temperature, the easier it is to produce these effects. However, the temperature is preferably set to 1,000° C. or less, considering the load on the equipment.

Further, the non-oxidizing gas may not contain fluorine. For example, a mixed gas consisting of $SiH_4$ gas and $Si_2H_6$ gas may be used. In this case, preferably, the temperature is set between 250° C. and 500° C., and the pressure is set to 0.1 Pa or less. These gases decompose at temperatures higher than 500° C. and thereby an Si film is formed, which is not desirable. The same problem occurs at pressures higher than 0.1 Pa.

The specification of Japanese Patent No. 3210510 discloses that the natural oxide film may be removed by use of absolute HF gas. However, the document does not describe any specific conditions under which the natural oxide film is removed. When oxygen is removed from the silicon surfaces of the device regions under an atmosphere of a fluorine containing gas, the device separation films formed of $SiO_2$, etc. are also etched. Therefore, oxygen generated due to such etching attaches to the silicon surfaces again. As such, the removal of oxygen from the silicon surfaces must be carried out under specific conditions.

The present inventor formed a silicon oxide film having a film thickness of 100 nm on a silicon substrate and then formed a contact hole having a size of 400 $\mu$m×400 $\mu$m in the formed silicon oxide film through dilute hydrofluoric acid treatment. After that, the sample is treated with HF gas for 1 minute under the conditions described in Japanese Laid-Open Patent Publications Nos. 5-214339 (1993) and 11-97434 (1999). This reduced the film thickness of the silicon oxide film (as a whole). However, the film thickness of the portion of the silicon oxide film at the opening increased; even the thinnest part was 2 nm thick. Observation of the surfaces of the opening of each sample under an AFM (Atomic Force Microscope) revealed that even the smoothest sample had an average surface roughness of 5 nm or more. The average surface roughness observed right after the dilute hydrofluoric acid treatment was approximately 0.4 nm. That is, the HF gas treatment increased the surface roughness, which is considered to be attributed to occurrence of re-oxidation and etching on the surface of the silicon substrate at the same time or alternately. The present invention, however, can solve the problem by setting the partial pressure of the non-oxidizing gas to 100 Pa or less and the treatment temperature to between 25° C. and 600° C., as described above.

Figure 2D:
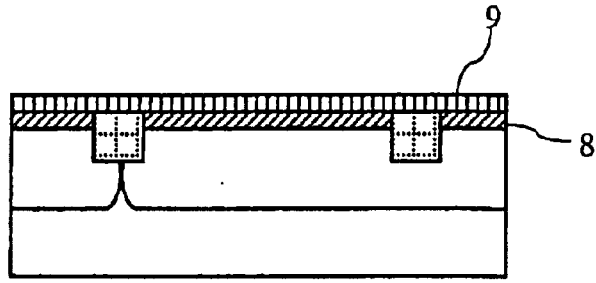

Subsequently, the remaining non-oxidizing gas and the gas generated by the reaction are evacuated from the reactor and oxygen is introduced into the reactor instead to form the silicon oxide film 8 on the silicon substrate 1, as shown in FIG. 2D. According to the present embodiment, the silicon substrate 1 is not exposed to the atmosphere during the series of processes from removal of the natural silicon oxide film from the surface of the silicon substrate 1 to formation of the silicon oxide film 8. Avoiding exposure of the silicon substrate 1 to the atmosphere can prevent foreign objects such as dust and water from attaching to it. Specifically, after removing the natural oxide film, the silicon oxide film is formed within the reactor still maintained at reduced pressure.

The temperature of the silicon oxidation reaction may be set between 650° C. and 900° C. to form a fine silicon oxide film. At that time, the rate of temperature increase is preferably set to 50° C./min or more. The higher the rate of temperature increase, the thinner the film thickness of the silicon oxide film. Furthermore, the partial pressure of the introduced oxygen is preferably set between 0.1 Pa and 500 Pa. With this arrangement, it is possible to form a silicon oxide film with a smooth surface having a suboxide content of 50% or less. In this case, the formed silicon oxide film consists of one or two atomic layers formed on the silicon surface.

Then, oxygen gas, water vapor, nitrous oxide gas, or nitrogen monoxide gas is introduced into the reactor still maintained at a temperature between 650° C. and 900° C. The partial pressure of the introduced gas may be maintained between 0.1 Pa and 500 Pa for 1 to 30 minutes to form a silicon oxide film having a film thickness of 1 nm or less. It should be noted that the lower the partial pressure of the introduced oxidizing gas or the oxidation treatment temperature, the thinner the silicon oxide film.

The heat treatment using the oxidizing gas changes the state of the silicon oxide film from a bonding state consisting of $Si_2O$, $SiO$, and $Si_2O_3$ to that consisting of only $SiO_2$, thereby reducing the suboxide content of the silicon oxide film. For example, a silicon oxide film having a film thickness between 0.5 nm and 1 nm has a suboxide content of 20% or less, and a silicon oxide film having a film thickness of 0.5 nm or less has a suboxide content between approximately 20% and 30%.

For example, after removing the HF gas from the reactor, oxygen gas is introduced into it. At that time, the partial pressure of the oxygen gas within the reactor is set to approximately 10 Pa. Then, the temperature within the reactor is increased to approximately 650° C. at a 250° C./min rate of temperature increase. After increasing the temperature, the supply of oxygen is stopped and water vapor having a partial pressure of approximately 0.1 Pa is introduced into the reactor instead. This state may be maintained for 5 minutes to form a silicon oxide film having a film thickness of approximately 0.5 nm. Table 1 below compares the suboxide content of the above silicon oxide film and those of silicon oxide films formed by other methods. It should be noted that the measurements were made using an X-ray photoelectron spectroscopy.

TABLE 1

| Sample | Suboxide Content (%) | $SiO_2$ Content (%) |
| --- | --- | --- |
| First Embodiment | 24 | 76 |
| Comparison Example 1 | 63 | 37 |
| Comparison Example 2 | 52 | 48 |
| Comparison Example 3 | 55 | 45 |

Referring to Table 1, comparison example 1 is a sample obtained as a result of cleaning the surface of the silicon substrate using an aqueous solution of dilute hydrofluoric acid. Comparison example 2 is a sample obtained as a result of water vapor oxidation at 650° C. for 5 minutes after the cleaning using an aqueous solution of dilute hydrofluoric acid. Furthermore, comparison example 3 is a sample obtained as a result of oxidation with dry oxygen gas at 650° C. for 10 minutes after the cleaning using an aqueous solution of dilute hydrofluoric acid.

It should be noted that in Table 1, "suboxide content" refers to $Si_2O$, $SiO$, and $Si_2O_3$ contents put together.

Since comparison example 1 has a suboxide content of as high as 63%, it is considered that the oxygen absorbed to the surface of the substrate has not yet formed a complete $SiO_2$ structure. Comparison examples 2 and 3 have suboxide contents a little lower than that of comparison example 1. Therefore, it is considered that part of the oxygen absorbed to the surface of the silicon substrate has formed an $SiO_2$ structure. The silicon oxide film of the present embodiment, on the other hand, has a suboxide content of 24%, which is much lower than those of comparison examples 1 to 3. This reduction is considered to be attributed to the fact that the natural silicon oxide film was removed by the fluorine containing gas after the cleaning using an aqueous solution of dilute hydrofluoric acid.

Then, the hafnium silicate film 9 is formed on the silicon oxide film 8 as the high dielectric constant insulating film, producing the structure shown in FIG. 2D.

According to the present embodiment, the high dielectric constant insulating film is formed without using an oxidizing gas such as oxygen gas, ozone gas, oxygen radicals, or water vapor. Specifically, it is formed by a CVD technique using an oxygen containing material. If the high dielectric constant insulating film is a metal oxide film, an oxygen containing metal complex may be used as the material. On the other hand, if the high dielectric constant insulating film is a metal silicate film, at least one of the metal material and the silicon material must contain oxygen.

For example, after forming the silicon oxide film, the reactor is further evacuated to remove moisture from it. Then, the temperature within the reactor is decreased to approximately 250° C., and a mixed gas consisting of tetra-t-butoxyhafnium and $Si_2H_6$ is introduced into the reactor to form a hafnium silicate film having a film thickness of approximately 2 nm.

It should be noted that instead of $Si_2H_6$, one of the following materials may be used (as the silicon material): $SiH_4$, tetraethylorthosilicate (aka tetraethoxysilane), tetrakisdiethylaminosilane, tetrakisdimethylaminosilane, tetrakismethylethylaminosilane, trisdiethylaminosilane, trisdimethylaminosilane, trismethylethylaminosilane, etc.

Further, instead of $Si_2H_6$, an oxygen containing material such as tetraethoxysilane or methyltrimethoxysilane may be used as the silicon material. In this case, the hafnium material may be an oxygen containing material such as tetra-t-butoxyhafnium, or a material containing no oxygen, such as tetrakisdiethylaminohafnium or tetrakisdimethylaminohafnium.

Further, if the high dielectric constant insulating film is a hafnium oxide film, an oxygen containing material such as tetra-t-butoxyhafnium or tetrakis (2,2,6,6-tetramethyl-3,5-heptanedionate) hafnium may be used.

Further, as the high dielectric constant insulating film, a silicate film of zirconium, lanthanum, or yttrium silicate may be used instead of the hafnium silicate film; and an oxide film of zirconium, lanthanum, yttrium, or aluminum oxide may be used instead of the hafnium oxide film. These alternatives must have the same ligands as those of the above hafnium materials.

It should be noted that the high dielectric constant insulating film is preferably formed without exposure to the atmosphere using the same reactor in which the silicon oxide film (the underlying film) was formed. However, if within a few hours, it can be exposed to the atmosphere after forming the silicon oxide film.

According to the present embodiment, the high dielectric constant insulating film is formed under an atmosphere containing no oxidizing gas, making it possible to prevent an increase in the film thickness of the silicon oxide film.

After forming the high dielectric constant insulating film, it is heat treated under an atmosphere of an oxidizing gas. The oxidizing gas may be oxygen gas. This oxygen gas may contain ozone or oxygen radicals. The heat treatment is preferably carried out at a temperature between 100° C. and 400° C. This supplies oxygen to the oxygen-deficient portions of the high dielectric constant insulating film produced as a result of forming the film under the atmosphere containing no oxidizing gas, making it possible to form an insulating film having good leakage current characteristics.

For example, the high dielectric constant insulating film (hafnium silicate film) is heat treated at 250° C. for 2 minutes under an atmosphere of oxygen gas (which may contain ozone). This can supply oxygen to the oxygen-deficient portions of the hafnium silicate film.

It is preferable to perform a process for increasing the nitrogen concentration of the surface of the high dielectric constant insulating film after the heat treatment. For example, the high dielectric constant insulating film may be heat treated under an atmosphere of ammonia gas or plasma-treated using nitrogen gas to increase the nitrogen concentration.

Then, a polysilicon film 15 is formed on the hafnium silicate film 9. The polysilicon film 15 is used to form the gate electrode. The polysilicon film 15 may be formed by, for example, a CVD method. It should be noted that an amorphous silicon film may be used instead of the polysilicon film 15. Subsequently, a resist pattern 16 is formed by a photolithographic technique.

Figure 2E:
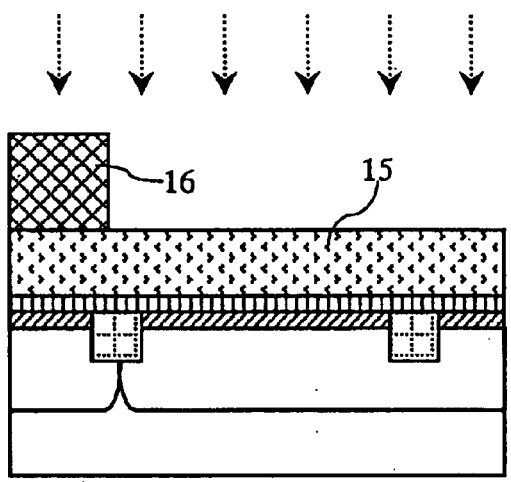

Then, as shown in FIG. 2E, boron (B) is ion implanted in the polysilicon film 15 using the resist pattern 16 as a mask (the polysilicon film 15 thereby becomes a P type diffusion layer). After removing the resist pattern 16, which is no longer necessary, phosphorous (P) is ion implanted in the polysilicon film 15 in the same manner. After that, heat treatment is applied to the polysilicon film (doped silicon film) 15 to reduce its resistance.

Figure 2F:
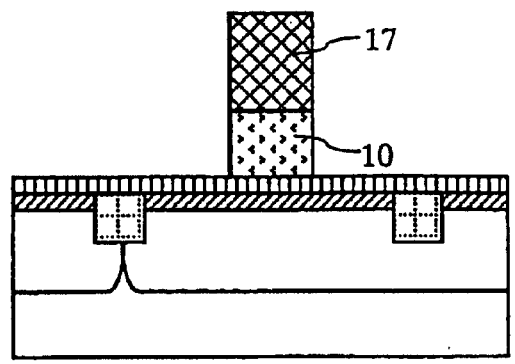

Then, as shown in FIG. 2F, a resist pattern 17 is formed by a photolithographic technique, and the polysilicon film 15 is etched using the resist pattern 17 as a mask, forming the gate electrode 10.

Figure 3A:
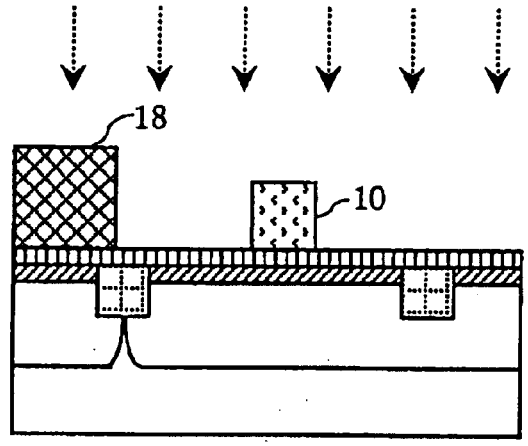
FIGS. 3A–3F are cross-sectional views showing a manufacturing process of the semiconductor device according to the first embodiment.
Figure 3B:
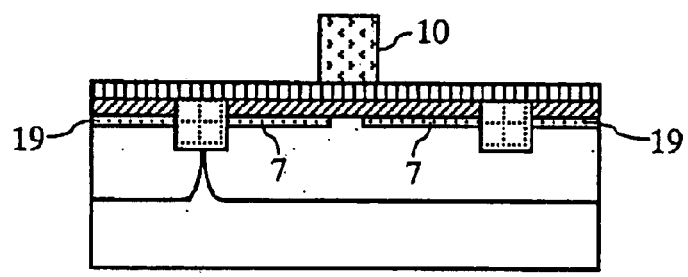

After removing the resist pattern 17, which is no longer necessary, a resist pattern 18 is formed by a photolithographic technique, as shown in FIG. 3A. Then, boron (B) is ion implanted in the N type diffusion layer 2 of the silicon substrate 1 using the gate electrode 10 and the resist pattern 18 as masks. After ion implanting phosphorous (P) in the P type diffusion layer 3 in the same manner, activation is carried out through heat treatment, forming the P type extension regions 7 and N type extension regions 19, as shown in FIG. 3B.

Figure 3C:
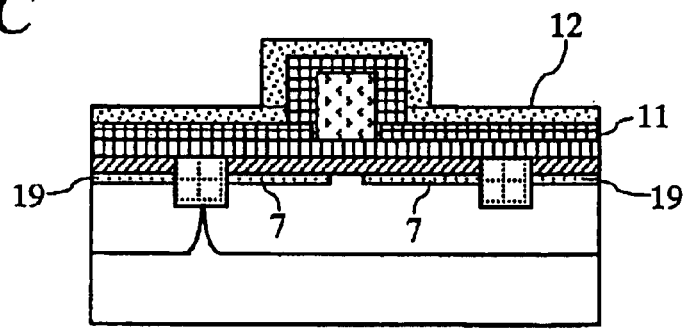
Figure 3D:
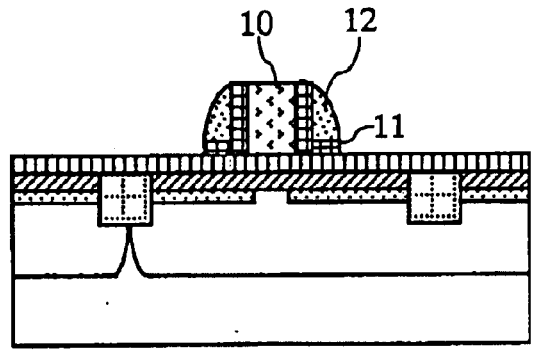

Then, the silicon oxide film 11 and the silicon nitride film 12 are formed sequentially on the entire surface by a CVD technique, etc., as shown in FIG. 3C. After that, reactive ion etching is carried out so as to remove portions of the silicon oxide film 11 and the silicon nitride film 12 other than those on the sidewalls of the gate electrode 10, producing the structure shown in FIG. 3D.

Figure 3E:
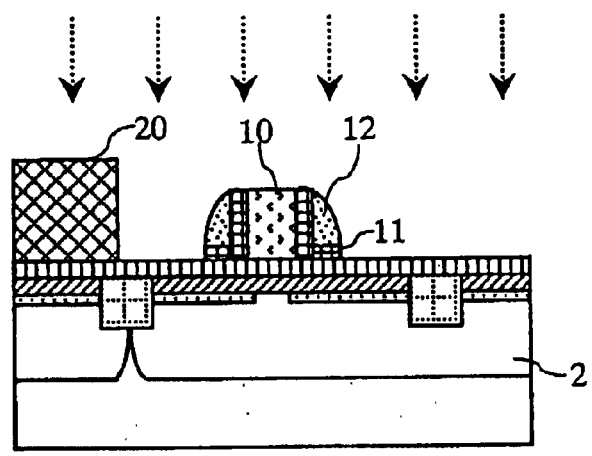
Figure 3F:
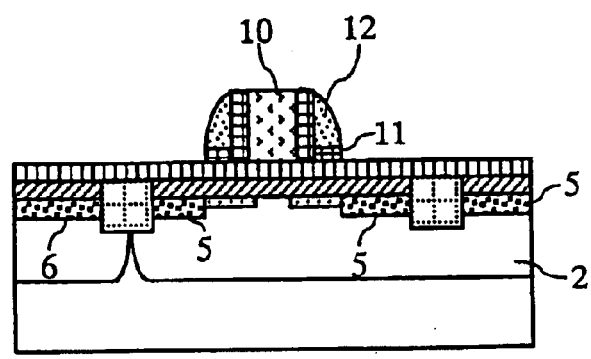

Then, as shown in FIG. 3E, a resist pattern 20 is formed by a photolithographic technique, and boron (B) is ion implanted in the N type diffusion layer 2 of the silicon substrate 1 using as masks the resist pattern 20 and the gate electrode 10, which has the silicon oxide film 11 and the silicon nitride film 12 formed on its sidewalls. After removing the resist pattern 20, which is no longer necessary, phosphorous (P) is ion implanted in the P type diffusion layer 3 in the same manner. Then, activation is carried out through heat treatment so as to form the P type source/drain diffusion layer 5 and the N type source/drain diffusion layer 6, as shown in FIG. 3F. After that, interlayer insulating films, contacts, wiring, etc. are formed by known methods, producing a semiconductor device.

The present embodiment forms a silicon oxide film on a silicon substrate after removing the natural oxide film on the silicon substrate using a non-oxidizing gas, making it possible to reduce the suboxide content of the silicon oxide film to 30% or less.

Further, the present embodiment forms a metal oxide film or a metal silicate film without using any oxidizing gas, making it possible to prevent an increase in the film thickness of the underlying silicon oxide film.

Still further, the present embodiment heat treats the metal oxide film or the metal silicate film under an atmosphere of an oxidizing gas after forming it, making it possible to supply oxygen to the oxygen-deficient portions of the metal oxide film or the metal silicate film.

Second Embodiment

A second embodiment of the present invention is characterized in that a silicon oxynitride film is used as a first insulating film.

Figure 4:
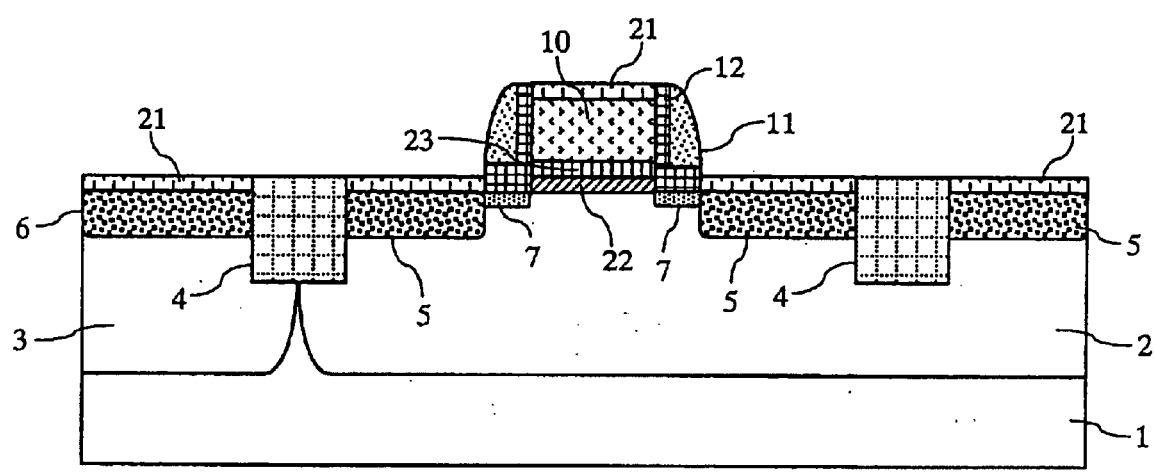
FIG. 4 is a cross-sectional view of the semiconductor device according to the second embodiment.

FIG. 4 is a cross-sectional view of a semiconductor device according to the present embodiment.

As shown in FIG. 4, in a silicon substrate 1 are formed an N type diffusion layer 2, a P type diffusion layer 3, device separation regions 4, a P type source/drain diffusion layer 5, an N type source/drain diffusion layer 6, and P type extension regions 7. Furthermore, a nickel silicide layer 21 is formed on the P type source/drain diffusion layer 5 and the N type source/drain diffusion layer 6. It should be noted that another metal silicide layer such as a cobalt silicide layer or a titanium silicide layer may be formed instead of the nickel silicide layer 21.

Also, a silicon oxynitride film 22 is formed on the silicon substrate 1 as a first insulating film. Furthermore, a hafnium silicate film 23 is formed on the silicon oxynitride film 22 as a second insulating film. It should be noted that according to the present invention, the first and second insulating films together constitute the gate insulating film.

A gate electrode 10 is formed on the hafnium silicate film 23. The gate electrode 10 is formed of a polysilicon film, and a silicon oxide film 11 and a silicon nitride film 12 are formed on the sidewalls of the gate electrode 10. Furthermore, another nickel silicide layer 21 is formed on the top of the gate electrode 10. It should be noted that another metal silicide layer such as a cobalt silicide layer or a titanium silicide layer may be formed instead of the nickel silicide layer 21.

According to the present embodiment, the film thickness of the silicon oxynitride film 22 is set to 1 nm or less, and its suboxide content is set to 30% or less. Further, the hafnium silicate film 23 of the present embodiment contains nitrogen. Another metal silicate film containing nitrogen may be used instead of the nitrogen containing hafnium silicate (hafnium silicon oxynitride) film 23 (as the second insulating film). Examples of such films are nitrogen containing zirconium silicate (zirconium silicon oxynitride) films, nitrogen containing lanthanum silicate (lanthanum silicon oxynitride) films, and nitrogen containing yttrium silicate (yttrium silicon oxynitride) films. Alternatively, the second insulating film may be a nitrogen containing metal silicate film of two or more metals selected from a group consisting of hafnium, zirconium, lanthanum, and yttrium. Further, it may be a nitrogen containing metal oxide film of one or more metals selected from a group consisting of hafnium, zirconium, lanthanum, yttrium, and aluminum.

It should be noted that the second insulating film (high dielectric constant insulating film) of the present embodiment is not limited to nitrogen containing metal silicate films and nitrogen containing metal oxide films. It may be a metal silicate film containing no nitrogen or a metal oxide film containing no nitrogen, as in the first embodiment.

For example, if it is assumed that the film thickness of the silicon oxynitride film 22 is 0.8 nm, its suboxide content is 25% or less, and the film thickness of the nitrogen containing hafnium silicate (hafnium silicon oxynitride) film 23 is 2.0 nm, then the EOT is 1.2 nm.

Description will be made of a method for manufacturing a semiconductor device according to the present embodiment with reference to FIGS. 4 and 5.

As in the steps shown in FIGS. 2A to 2C described in connection with the first embodiment, a silicon oxide film is buried in predetermined regions of the silicon substrate 1 to form the device separation regions 4 having an STI structure and a sacrificial silicon oxide film 13. Then, the N type diffusion layer 2 and the P type diffusion layer 3 are formed through ion implantation.

Then, the sacrificial silicon oxide film 13 is removed by use of an aqueous solution of ammonium fluoride ($NH_4F$). After that, the surface of the silicon substrate 1 is cleaned by use of an aqueous solution of approximately 0.5 to 5% dilute hydrofluoric acid. Immediately after the cleaning process, the silicon substrate 1 is placed in a reactor (not shown). The reactor is then evacuated to sufficiently remove oxygen and water from it. Subsequently, the temperature within the reactor is increased to between 25° C. and 600° C., and a non-oxidizing gas is introduced into it. At that time, the partial pressure of the non-oxidizing gas within the reactor is preferably set to 100 Pa or less.

The non-oxidizing gas may be, for example, a fluorine containing gas.

For example, after increasing the temperature within the reactor to 300° C., HF (hydrogen fluoride) gas is introduced into it. At that time, the partial pressure of the HF gas is set to approximately 10 Pa. Maintaining this state for 5 minutes can remove the natural oxide film formed on the surfaces of the silicon substrate.

Examples of the fluorine containing gas include, in addition to HF gas, $ClF_3$ gas, $F_2$ gas, $NF_3$ gas, and a mixture thereof.

A further example of the fluorine containing gas is a mixed gas consisting of CO gas, H2 gas, $CF_4$ gas, $SF_6$ gas, He gas, Ar gas, and $N_2$ gas. In this case, the temperature and the pressure are preferably set to 250° C. or more and 1 Pa or less, respectively. The natural oxide film can be removed by the reduction action of the CO gas and $H_2$ gas. Furthermore, the oxygen absorbed to the silicon substrate 1 can be removed by the $CF_4$ gas, $SF_6$ gas, He gas, Ar gas, and $N_2$ gas. It should be noted that the higher the temperature, the easier it is to produce these effects. However, the temperature is preferably set to 1,000° C. or less, considering the load on the equipment.

Further, the non-oxidizing gas may not contain fluorine. For example, a mixed gas consisting of $SiH_4$ gas and $Si_2H_6$ gas may be used. In this case, preferably, the temperature is set between 250° C. and 500° C., and the pressure is set to 0.1 Pa or less. These gases decompose at temperatures higher than 500° C. and thereby an Si film is formed, which is not desirable. The same problem occurs at pressures higher than 0.1 Pa.

Subsequently, after evacuating the remaining non-oxidizing gas and the gas generated by the reaction from the reactor, the silicon oxynitride film 22 is formed on the surface of the silicon substrate 1. According to the present embodiment, the silicon substrate is not exposed to the atmosphere during the series of processes from removal of the natural oxide film from the surface of the silicon substrates to formation of the silicon oxynitride film. Avoiding exposure of the silicon substrate 1 to the atmosphere can prevent foreign objects such as dust and water from attaching to it. Specifically, after removing the natural silicon oxide film, the silicon oxynitride film is formed within the reactor still maintained at reduced pressure.

The silicon oxynitride film can be formed by first forming a silicon oxide film and then nitriding it. Specifically, a silicon oxide film formed as in the first embodiment is heat treated under an atmosphere of ammonia $NH_3$ so as to nitride it. For example, the partial pressure of the ammonia $NH_3$ is set between 1 Pa and 10,000 Pa, and the silicon oxide film is heat treated at a temperature between 600° C. and 900° C. for 1 to 10 minutes.

The film thickness of the silicon oxynitride film depends on that of the silicon oxide film of which it is formed. Therefore, for example, if it is intended to form a silicon oxynitride film having a small film thickness, then a silicon oxide film having a small film thickness must be formed beforehand.

For example, after removing the HF gas from the reactor, oxygen gas is introduced into it. At that time, the partial pressure of the oxygen gas within the reactor is set to approximately 10 Pa. Then, the temperature within the reactor is increased to approximately 650° C. at a 250° C./min rate of temperature increase. After increasing the temperature, the supply of oxygen is stopped and water vapor having a partial pressure of approximately 0.1 Pa is introduced into the reactor instead. This state may be maintained for 3 minutes to form a silicon oxide film having a film thickness of approximately 0.4 nm. After further evacuating the reactor to remove moisture, etc., $NH_3$ gas is introduced into it. At that time, the temperature is set to 650° C. and the partial pressure of the $NH_3$ gas is set to 100 Pa. This state may be maintained for 5 minutes to form a silicon oxynitride film having a film thickness of approximately 0.8 nm.

Then, the hafnium silicate film 23 is formed on the silicon oxynitride film 22 as the second insulating film.

According to the present embodiment, as in the first embodiment, the high dielectric constant insulating film (the second insulating film) is formed without using an oxidizing gas such as oxygen gas, ozone gas, oxygen radicals, or water vapor. Specifically, it is formed by a CVD technique using an oxygen containing material. If the high dielectric constant insulating film is a metal oxide film, an oxygen containing metal complex is used as the material. On the other hand, if the high dielectric constant insulating film is a metal silicate film, at least one of the metal material and the silicon material must contain oxygen.

For example, after forming the silicon oxynitride film, the temperature within the reactor is decreased to approximately 250° C. Then, a mixed gas consisting of tetra-t-butoxyhafnium, $Si_2H_6$, and $NH_3$ is introduced into the reactor to form a nitrogen containing hafnium silicate (hafnium silicon oxynitride) film having a film thickness of approximately 2 nm.

It should be noted that instead of $Si_2H_6$, one of the following materials may be used (as the silicon material): $SiH_4$, tetraethylorthosilicate (aka tetraethoxysilane), tetrakisdiethylaminosilane, tetrakisdimethylaminosilane, tetrakismethylethylaminosilane, trisdiethylaminosilane, trisdimethylaminosilane, trismethylethylaminosilane, etc.

Further, instead of $Si_2H_6$, an oxygen containing material such as tetraethoxysilane or methyltrimethoxysilane may be used as the silicon material. In this case, the hafnium material may be an oxygen containing material such as tetra-t-butoxyhafnium, or a material containing no oxygen, such as tetrakisdiethylaminohafnium or tetrakisdimethylaminohafnium.

Further, if the high dielectric constant insulating film is a hafnium oxide film, an oxygen containing material such as tetra-t-butoxyhafnium or tetrakis (2,2,6,6-tetramethyl-3,5-heptanedionate) hafnium may be used.

Further, as the high dielectric constant insulating film, a silicate film of zirconium, lanthanum, or yttrium silicate may be used instead of the hafnium silicate film; and an oxide film of zirconium, lanthanum, yttrium, or aluminum oxide may be used instead of the hafnium oxide film. These alternatives must have the same ligands as those of the above hafnium materials.

According to the present embodiment, the high dielectric constant insulating film is formed under an atmosphere containing no oxidizing gas, making it possible to prevent an increase in the film thickness of the silicon oxynitride film.

After forming the high dielectric constant insulating film, it is heat treated under an atmosphere of oxygen gas, as in the first embodiment. The oxygen gas may contain oxygen radicals or ozone. This can supply oxygen to produced oxygen-deficient portions of the high dielectric constant insulating film. For example, the high dielectric constant insulating film may be heat treated at 250° C. for 2 minutes under an atmosphere of oxygen gas (which may contain ozone) to supply oxygen to the oxygen-deficient portions of the hafnium silicate film.

If it is intended to increase the nitrogen concentration of the surface portion of the hafnium silicate film, the film is heat treated under an atmosphere of $NH_3$ after the above heat treatment. For example, after increasing the temperature within the reactor from 250° C. to 850° C. at a 250° C./min rate of temperature increase under an atmosphere of $NH_3$ gas, the hafnium silicate film is heat treated for a predetermined period of time. It should be noted that plasma treatment using nitrogen gas may be applied to the hafnium silicate film instead of the above heat treatment under an atmosphere of $NH_3$.

According to the present embodiment, a silicon oxide film and a hafnium silicate film may be formed sequentially on the silicon substrate, and then a nitriding process may be carried out so as to change the silicon oxide film into a silicon oxynitride film. For example, a silicon oxide film is formed on the silicon substrate by the method described above. Then, a hafnium silicate film is formed on the silicon oxide film. After that, a heat treatment process is carried out under an oxidizing gas atmosphere to supply oxygen to produced oxygen-deficient portions of the hafnium silicate film. Then, the substrate may be heat treated at 850° C. under an atmosphere of $NH_3$ gas having a partial pressure of 1,000 Pa to change the silicon oxide film into a silicon oxynitride film. It should be noted that oxygen produced from the silicon oxide film when it is nitrided may also contribute to the oxygen supply to the oxygen-deficient portions of the hafnium silicate film.

Then, as in the steps shown in FIGS. 2E and 2F described in connection with the first embodiment, the gate electrode 10 is formed. Specifically, first of all, a polysilicon film is formed on the hafnium silicate film 23. The polysilicon film is used to form the gate electrode. An amorphous silicon film may be used instead of the polysilicon film. Then, after implanting ions in the polysilicon film, it is etched to form the gate electrode 10.

Figure 5:
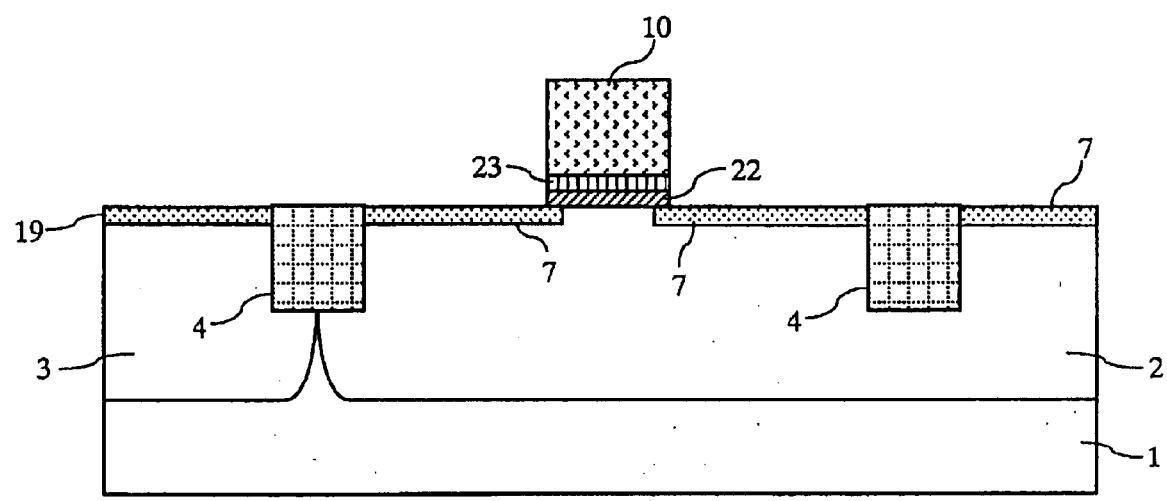
FIG. 5 is a cross-sectional view showing a manufacturing process of the semiconductor device according to the second embodiment.

Then, the portions of the silicon oxynitride film 22 and the hafnium silicate film 23 on the P type source/drain diffusion layer 5 and the N type source/drain diffusion layer 6 are removed by etching using the gate electrode 10 as a mask, as shown in FIG. 5. After that, the silicon oxide film 11 and the silicon nitride film 12 are formed on the sidewalls of the gate electrode 10, as in the first embodiment.

Then, a nickel film (not shown) and a titanium nitride film (not shown) are sequentially formed. They are heat treated so that the nickel reacts with the silicon to form a nickel silicide. After that, the titanium nitride film and the unreacted part of the nickel film are removed through etching to selectively form nickel silicide layers 21 on the gate electrode 10, the P type source/drain diffusion layer 5, and the N type source/drain diffusion layer 6.

After forming the nickel silicide layers 21, the P type extension regions 7 and N type extension regions 19 are formed, and then the P type source/drain diffusion layer 5 and the N type source/drain diffusion layer 6 are formed, as in the steps shown in FIGS. 3A to 3F described in connection with the first embodiment. After that, interlayer insulating films, contacts, wiring, etc. are formed by known methods, producing a semiconductor device.

Table 2 below compares the first and the second embodiments in terms of the interface state density between the silicon substrate and the first insulating film. It should be noted that in Table 2, "suboxide content" refers the amount of suboxide within the silicon oxide film or silicon oxynitride film.

TABLE 2

|  | Interface State Density ($cm^{-2}eV^{-1}$) | |
| --- | --- | --- |
| First Insulating Film | Suboxide Content 30% | Suboxide Content 50% |
| Silicon Oxide Film (First Embodiment) | $1.8 \times 10^{10}$ | $7 \times 10^{10}$ |
| Silicon Oxynitride Film (Second Embodiment) | $1.8 \times 10^{10}$ | $2 \times 10^{11}$ |

Generally, the lower the interface state density, the better, in terms of the device characteristics. Specifically, the interface state density is considered to have only a small impact on the device characteristics when its value is $2\times10^{10}$ $cm^{-2}$ $eV^{-1}$ or less. On the other hand, as can be seen from Table 2, there is a correlation between the interface state density and the suboxide content of the first insulating film. That is, Table 2 indicates that it is preferable to set the suboxide content to 30% or less in terms of the device characteristics, whether a silicon oxide film or a silicon oxynitride film may be used.

The present embodiment forms a silicon oxynitride film on a silicon substrate after removing the natural oxide film on the silicon substrate using a non-oxidizing gas, making it possible to reduce the suboxide content of the silicon oxynitride film to 30% or less.

Further, the present embodiment forms a metal oxide film or a metal silicate film without using any oxidizing gas, making it possible to prevent an increase in the film thickness of the underlying silicon oxynitride film.

Third Embodiment

Figure 6:
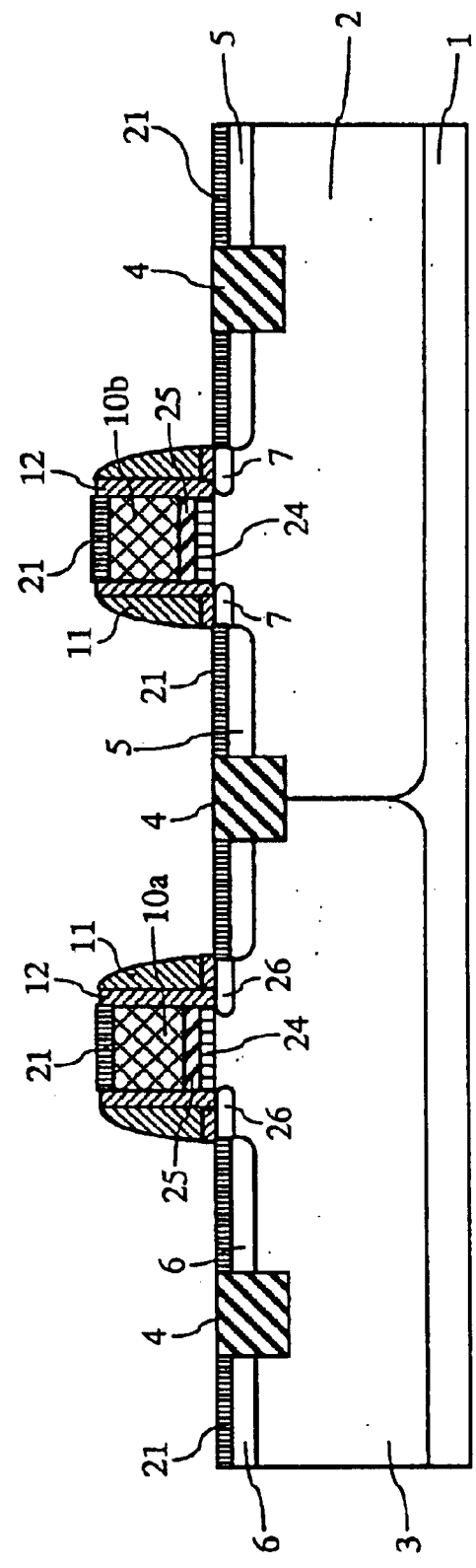
FIG. 6 is a cross-sectional view of the semiconductor device according to the third embodiment.

FIG. 6 is a cross-sectional view of a semiconductor device according to a third embodiment of the present invention. The semiconductor device has a structure similar to that of the semiconductor device of the second embodiment shown in FIG. 4. However, the third embodiment is characterized in that a silicon nitride film is used as a first insulating film.

As shown in FIG. 6, in a silicon substrate 1 are formed an N type diffusion layer 2, a P type diffusion layer 3, device separation regions 4, a P type source/drain diffusion layer 5, an N type source/drain diffusion layer 6, P type extension regions 7, and N type extension regions 26. Furthermore, a nickel silicide layer 21 is formed on the P type source/drain diffusion layer 5 and the N type source/drain diffusion layer 6. It should be noted that another metal silicide layer such as a cobalt silicide layer or a titanium silicide layer may be formed instead of the nickel silicide layer 21.

Also, a silicon nitride film 24 is formed on the silicon substrate 1 as a first insulating film. Furthermore, a hafnium silicate film 25 is formed on the silicon nitride film 24 as a second insulating film. It should be noted that according to the present invention, the first and second insulating films together constitute the gate insulating film.

Gate electrodes 10a and 10b are formed on the hafnium silicate film 25. The gate electrodes 10a and 10b are formed of a polysilicon film, and a silicon oxide film 11 and a silicon nitride film 12 are formed on the sidewalls of the gate electrodes 10a and 10b. Furthermore, another nickel silicide layer 21 is formed on the top of each of the gate electrodes 10a and 10b. It should be noted that another metal silicide layer such as a cobalt silicide layer or a titanium silicide layer may be formed instead of the nickel silicide layer 21.

According to the present embodiment, the film thickness of the silicon nitride film 24 is set to 1 nm or less, and its oxygen concentration is set to less than 0.1 atom %. The hafnium silicate film 25 contains nitrogen. A nitrogen containing zirconium silicate (zirconium silicon oxynitride) film, a nitrogen containing lanthanum silicate (lanthaum silicon oxynitride) film, or a nitrogen containing yttrium silicate (yttrium silicon oxynitride) film may be used instead of the nitrogen containing hafnium silicate (hafnium silicon oxynitride) film 25 (as the second insulating film). Alternatively, the second insulating film may be a nitrogen containing metal silicate film of two or more metals selected from a group consisting of hafnium, zirconium, lanthanum, and yttrium. Further, it may be a nitrogen containing metal oxide film of one or more metals selected from a group consisting of hafnium, zirconium, lanthanum, yttrium, and aluminum.

It should be noted that the second insulating film of the present embodiment is not limited to nitrogen containing metal silicate films and nitrogen containing metal oxide films. It may be a metal silicate film containing no oxygen or a metal oxide film containing no nitrogen, as in the first embodiment.

For example, if it is assumed that the film thickness of the silicon nitride film 24 is 0.9 nm, its oxygen concentration is less 0.1 atom %, and the film thickness of the nitrogen containing hafnium silicate (hafnium silicon oxynitride) film 25 is 2.0 nm, then the EOT is 1.2 nm.

Description will be made below of a method for manufacturing a semiconductor device according to the present embodiment.

As in the steps shown in FIGS. 2A to 2C described in connection with the first embodiment, first a silicon oxide film is buried in predetermined regions of the silicon substrate 1 to form device separation regions 4 having an STI structure and a sacrificial oxide film 13. Then, the N type diffusion layer 2 and the P type diffusion layer 3 are formed through ion implantation.

Then, the sacrificial silicon oxide film 13 is removed by use of an aqueous solution of ammonium fluoride ($NH_4F$). After that, the surface of the silicon substrate 1 is cleaned by use of an aqueous solution of approximately 0.5 to 5% dilute hydrofluoric acid. Immediately after the cleaning process, the silicon substrate 1 is placed in a reactor (not shown). The reactor is then evacuated to sufficiently remove oxygen and water from it. Subsequently, the temperature within the reactor is increased to between 25° C. and 600° C., and a non-oxidizing gas is introduced into it. At that time, the partial pressure of the non-oxidizing gas within the reactor is preferably set to 100 Pa or less.

The non-oxidizing gas may be, for example, a fluorine containing gas.

For example, after increasing the temperature within the reactor to 300° C., HF (hydrogen fluoride) gas is introduced into it. At that time, the partial pressure of the HF gas is set to approximately 10 Pa. Maintaining this state for 5 minutes can remove the natural oxide film formed on the surface of the silicon substrate.

Examples of the fluorine containing gas include, in addition to HF gas, $ClF_3$ gas, $F_2$ gas, $NF_3$ gas, and a mixture thereof.

A further example of the fluorine containing gas is a mixed gas consisting of CO gas, $H_2$ gas, $CF_4$ gas, $SF_6$ gas, He gas, Ar gas, and $N_2$ gas. In this case, the temperature and the pressure are preferably set to 250° C. or more and 1 Pa or less, respectively. The natural oxide film can be removed by the reduction action of the CO gas and $H_2$ gas. Furthermore, the oxygen absorbed to the silicon substrate 1 can be removed by the $CF_4$ gas, $SF_6$ gas, He gas, Ar gas, and $N_2$ gas. It should be noted that the higher the temperature, the easier it is to produce these effects. However, the temperature is preferably set to 1,000° C. or less, considering the load on the equipment.

Further, the non-oxidizing gas may not contain fluorine. For example, a mixed gas consisting of $SiH_4$ gas and $Si_2H_6$ gas may be used. In this case, preferably, the temperature is set between 250° C. and 500° C., and the pressure is set to 0.1 Pa or less. These gases decompose at temperatures higher than 500° C. and thereby an Si film is formed, which is not desirable. The same problem occurs at pressures higher than 0.1 Pa.

Subsequently, after evacuating the remaining non-oxidizing gas and the gas generated by the reaction from the reactor, the silicon nitride film 24 is formed on the surface of the silicon substrate 1. According to the present embodiment, the silicon substrate is not exposed to the atmosphere during the series of processes from removal of the natural oxide film from the surface of silicon substrate to formation of the silicon nitride film. Avoiding exposure of the silicon substrate 1 to the atmosphere can prevent foreign objects such as dust and water from attaching to it. Specifically, after removing the natural oxide film, the silicon nitride film is formed within the reactor still maintained at reduced pressure.

The silicon nitride film may be formed as follows. The silicon substrate is placed in an atmosphere of $NH_3$ gas having a partial pressure between 1 Pa and 10,000 Pa. Then, the temperature within the reactor is increased to between 600° C. and 900° C. at a 50° C./min or more rate of temperature increase, and then the silicon substrate is heat treated for 1 to 30 minutes. At that time, it is arranged that the partial pressure of the $NH_3$ gas after increasing the temperature is also between 1 Pa and 10,000 Pa. With this, a silicon nitride film having a film thickness of 1 nm or less and an oxygen concentration of less than 0.1 atom % can be formed.

Conventional methods for manufacturing a semiconductor device have a problem in that forming a silicon nitride film directly on a surface of a silicon substrate produces a level which captures or generates carriers. This is attributed to oxygen existing in the interface portion between the silicon substrate and the silicon nitride film. The present embodiment, on the other hand, forms a silicon nitride film on a silicon substrate after removing the oxygen in the surface of the silicon substrate, making it possible to reduce the amount of oxygen in the interface portion between the silicon substrate and the silicon nitride film. Therefore, it is possible to reduce the occurrence of a level which captures or generates carriers in the surface of the silicon substrate and in the silicon nitride film.

Japanese Laid-Open Patent Publication No. 2002-324902 describes that good device characteristics can be obtained by using a silicon nitride film or a silicon oxynitride film in which no chemical bonds are formed between the hydrogen and silicon atoms. On the other hand, even though the present embodiment forms a silicon nitride film which contains chemical bonds formed between hydrogen and silicon atoms, no degradation in the characteristics due to these bonds has been observed.

In an N-channel transistor having an EOT of 1.2 nm and containing boron (B) in a dose amount of $1\times10^{18}$ cm$^{-3}$, when the oxygen concentration of the silicon nitride film was 0.1%, the carrier mobility was 220 cm$^2$/Vs at a breakdown voltage of 1.0 MV/cm. When, on the other hand, the oxygen concentration of the silicon nitride film was 0.5%, the carrier mobility was 60 cm$^2$/Vs under the same conditions. Therefore, to obtain a mobility value higher than 220 cm$^2$/Vs, the oxygen concentration of the silicon nitride film is preferably set to 0.1% or less.

For example, after removing the HF gas from the reactor, NH$_3$ gas is introduced into it. At that time, the partial pressure of the NH$_3$ gas within the reactor is set to approximately 1,000 Pa. Then, the temperature within the reactor is increased to approximately 750° C. at a 250° C./min rate of temperature increase. After increasing the temperature, the partial pressure of the NH$_3$ gas is reduced to 100 Pa. This state may be maintained for 7 minutes to form a silicon nitride film having a film thickness of 0.8 nm.

Then, the nitrogen containing hafnium silicate (hafnium silicon oxynitride) film 25 is formed on the silicon nitride film 24 as the second insulating film.

According to the present embodiment, as in the first embodiment, the high dielectric constant insulating film (the second insulating film) is formed without using an oxidizing gas such as oxygen gas, ozone gas, oxygen radicals, or water vapor. Specifically, it is formed by a CVD technique using an oxygen containing material. If the high dielectric constant insulating film is a metal oxide film, an oxygen containing metal complex is used as the material. On the other hand, if the high dielectric constant insulating film is a metal silicate film, at least one of the metal material and the silicon material must contain oxygen.

For example, after forming the silicon nitride film, the temperature within the reactor is decreased to approximately 250° C. Then, a mixed gas consisting of tetra-t-butoxyhafnium, Si$_2$H$_6$, and NH$_3$ is introduced into the reactor to form a nitrogen containing hafnium silicate (hafnium silicon oxynitride) film having a film thickness of approximately 2 nm.

It should be noted that instead of Si$_2$H$_6$, one of the following materials may be used (as the silicon material): SiH$_4$, tetraethylorthosilicate (aka tetraethoxysilane), tetrakisdiethylaminosilane, tetrakisdimethylaminosilane, tetrakismethylethylaminosilane, trisdiethylaminosilane, trisdimethylaminosilane, trismethylethylaminosilane, etc.

Further, instead of Si$_2$H$_6$, an oxygen containing material such as tetraethoxysilane or methyltrimethoxysilane may be used as the silicon material. In this case, the hafnium material may be an oxygen containing material such as tetra-t-butoxyhafnium, or a material containing no oxygen, such as tetrakisdiethylaminohafnium or tetrakisdimethylaminohafnium.

Further, if the high dielectric constant insulating film is a hafnium oxide film, an oxygen containing material such as tetra-t-butoxyhafnium or tetrakis (2,2,6,6-tetramethyl-3,5-heptanedionate) hafnium may be used.

Further, as the high dielectric constant insulating film, a silicate film of zirconium, lanthanum, or yttrium silicate may be used instead of the hafnium silicate film; and an oxide film of zirconium, lanthanum, yttrium, or aluminum oxide may be used instead of the hafnium oxide film. These alternatives must have the same ligands as those of the above hafnium materials.

According to the present embodiment, the high dielectric constant insulating film is formed under an atmosphere containing no oxidizing gas, making it possible to prevent an increase in the film thickness of the silicon nitride film due to oxidation.

After forming the high dielectric constant insulating film, it is heat treated under an atmosphere of an oxygen gas, as in the first embodiment. The oxygen gas may contain oxygen radicals or ozone. This treatment can supply oxygen to produced oxygen-deficient portions of the high dielectric constant insulating film. For example, the high dielectric constant insulating film may be heat treated at 250° C. for 2 minutes under an atmosphere of an oxygen gas (which may contain ozone) to supply oxygen to the oxygen-deficient portions of the hafnium silicate film.

It is preferable to perform a process for enhancing the nitrogen concentration of the surface of the high dielectric constant insulating film after the heat treatment. For example, the high dielectric constant insulating film may be heat treated under an atmosphere of ammonia gas or plasma-treated using nitrogen gas to increase the nitrogen concentration.

Then, as in the steps shown in FIGS. 2E and 2F described in connection with the first embodiment, a polysilicon film is formed on the hafnium silicate film 25. The polysilicon film is used to form the gate electrodes. An amorphous silicon film may be used instead of the polysilicon film. Then, after implanting ions in the polysilicon film, it is etched to form the gate electrodes 10a and 10b.

Then, nickel silicide layers 21 are selectively formed on the gate electrodes 10a and 10b, the P type source/drain diffusion layer 5, and the N type source/drain diffusion layer 6, as in the step shown in FIG. 5 described in connection with the second embodiment.

After forming the nickel silicide layers 21, the P type extension regions 7 and N type extension regions 19 are formed, and then the P type source/drain diffusion layer 5 and the N type source/drain diffusion layer 6 are formed, as in the steps shown in FIGS. 3A to 3F described in connection to the first embodiment. After that, interlayer insulating films, contacts, wiring, etc. are formed by known methods, producing a semiconductor device.

The present embodiment forms a silicon nitride film having a film thickness of 1 nm or less and an oxygen concentration of less than 0.1 atom % on a silicon substrate after removing the natural oxide film on the silicon substrate using a non-oxidizing gas, making it possible to reduce the occurrence of a level which captures or generates carriers in the surface of the silicon substrate and in the silicon nitride film.

Description will be made below of a reactor suitable for the methods for manufacturing a semiconductor device according to the present invention.

The reactor used by the first to third embodiments is preferably constructed as follows. Its main body is made of quartz, and the reactor has a mechanism which allows the main body to be externally heated. Gases used for reactions are introduced into the reactor main body through a flow rate control mechanism. Furthermore, the reactor has a mechanism capable of controlling the pressure within the reactor main body as well as discharging the internal gas. With such a reactor, it is not necessary to expose the silicon substrate to the atmosphere during the series of processes from removal of oxygen from the surface of the silicon substrate to formation of the high dielectric constant insulating film and to heat treatment. Therefore, it is possible to prevent foreign objects such as dust from attaching to the silicon substrate as well as preventing moisture from being absorbed to it.

It should be noted that when a method of the present invention for manufacturing a semiconductor device is performed, metals, etc. constituting the metal oxide film or the metal silicate film attach to the insidewalls of the reactor. If the method of the present invention for manufacturing a semiconductor device is performed again in this state, the attached metals leave the sidewalls and attach to the silicon substrate as impurities, forming an impurity-induced level at the interface between the silicon substrate and the gate insulating film and thereby degrading the device characteristics. Therefore, the reactor need be cleaned according to the process sequence shown in FIG. 7, for example.

Figure 7:
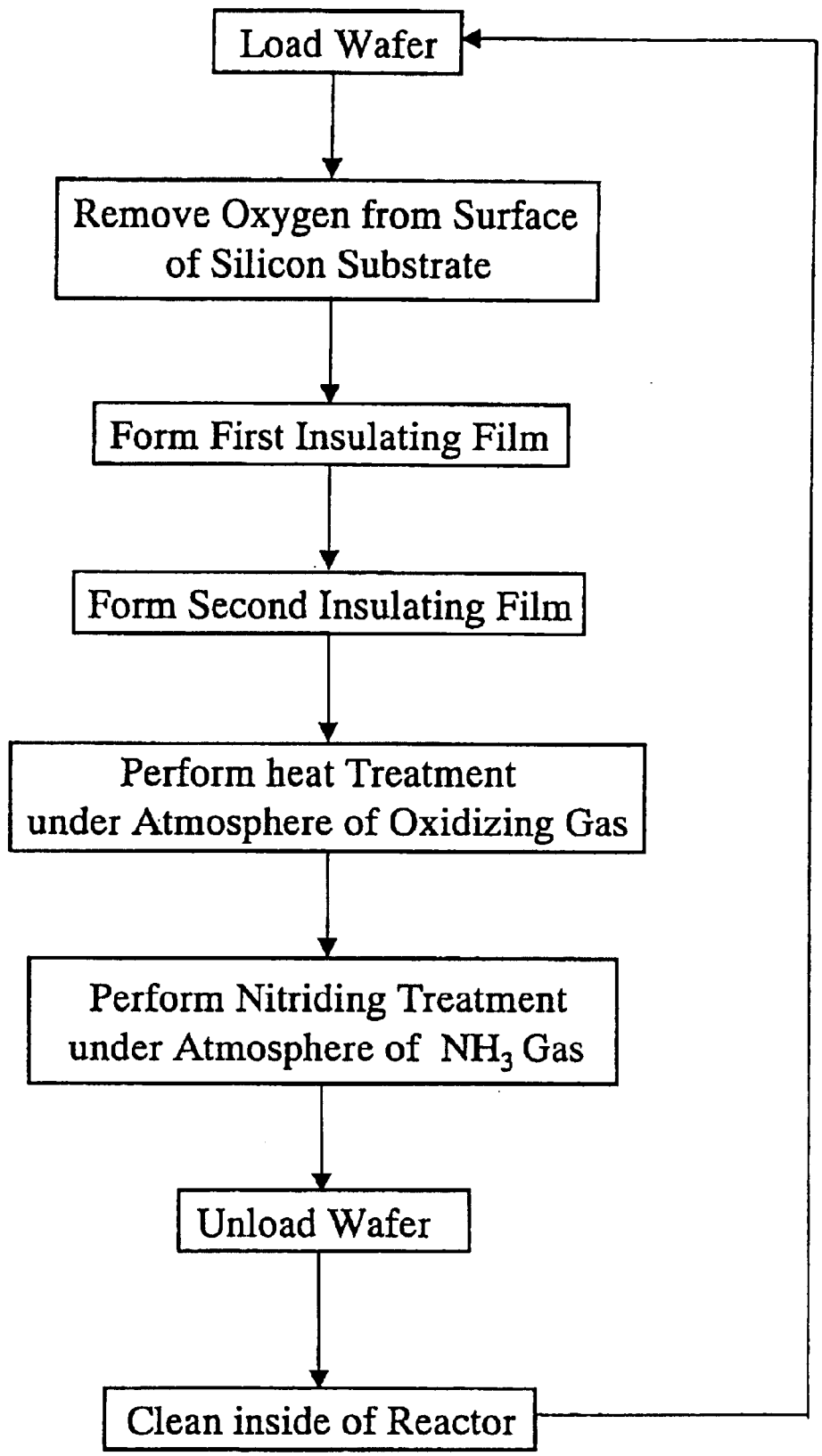
FIG. 7 shows a process sequence used when the reactor is applied to the method of the present invention.

FIG. 7 shows a process sequence used when the above reactor is applied to the method of the second embodiment. After loading a wafer and removing oxygen from the surface of the silicon substrate, first and second insulating films are formed sequentially. Then, a process for increasing the nitrogen concentration of the surface of the second insulating film is performed. Specifically, the silicon substrate may be heat treated under an atmosphere of an oxidizing gas and further heat treated under an atmosphere of $NH_3$ gas to increase the nitrogen concentration of the surface of the second insulating film. It should be noted that the nitrogen concentration of the surface of the second insulating film may be increased through plasma treatment using nitrogen gas. After that, the wafer is unloaded and the inside of the reactor is cleaned.

The cleaning is accomplished by, for example, introducing a non-oxidizing gas (e.g., a fluorine containing gas) into the reactor main body. In this case, since the film thickness of the formed metal oxide film or metal silicate film is very thin (a few nanometers), the cleaning can be carried out at the same temperature and pressure as those employed in the process of removing oxygen from the surface of the silicon substrate, described in connection with the first to third embodiments. However, the conditions need not be exactly the same as those for the oxygen removing process since it is enough to remove only the metal oxide film or the metal silicate film attached to the insidewalls. It should be noted that it is preferable to change the cleaning time depending on the type and the film thickness of the formed film.

After cleaning the reactor, a wafer is loaded again and the above process sequence is repeated.

While the present invention has been described by specific reference to preferred embodiments, it is understood that variations and modifications thereof may be made without departing from the spirit of the present invention. For example, the present invention can be applied to MIS transistors having a buried gate electrode. In such a case, the gate electrode may be formed of impurity-doped silicon described in connection with the first to third embodiments. Further, the gate electrode may be a metal film such as a tungsten film, titanium film, ruthenium film, tantalum film, or hafnium film, or a nitride film of one of these metals.

The features and advantages of the present invention may be summarized as follows.

The present invention can reduce an increase in the film thickness of the underlying silicon oxide film and thereby provide a semiconductor device having good device characteristics.

Obviously many modifications and variations of the present invention are possible in the light of the above teaching. It is therefore to be understood that within the scope of the appended claims the invention may be practiced otherwise than as specifically described.

The entire disclosure of a Japanese Patent Application No. 2003-093989, filed on Mar. 31, 2003 including specification, claims, drawings and summary, on which the Convention priority of the present application is based, are incorporated herein by reference in its entirety.

What is claimed is:

1. A semiconductor device comprising:
   a first insulating film on a silicon substrate; and
   a second insulating film on said first insulating film, wherein
   said first insulating film is a silicon oxide film having a thickness not exceeding 1 nm and a suboxide content not exceeding 30%; and
   said second insulating film is a high dielectric constant insulating film.

2. The semiconductor device according to claim 1, wherein said high dielectric constant insulating film is selected from the group consisting of a metal oxide film and a metal silicate film.

3. The semiconductor device according to claim 2, wherein said metal oxide film is an oxide film including at least one metal selected from the group consisting of hafnium, zirconium, lanthanum and yttrium.

4. The semiconductor device according to claim 2, wherein said metal silicate film is a silicate film including at least one metal selected from the group consisting of hafnium, zirconium, lanthanum, yttrium, and aluminum.

5. The semiconductor device according to claim 4, wherein said metal silicate film contains nitrogen.

6. A semiconductor device comprising:
   a first insulating film on a silicon substrate; and
   a second insulating film on said first insulating film, wherein
   said first insulating film is a silicon oxynitride film having a thickness not exceeding 1 nm and a suboxide content not exceeding 30%; and
   said second insulating film is a high dielectric constant insulating film.

7. The semiconductor device according to claim 6, wherein said high dielectric constant insulating film is selected from the group consisting of a metal oxide film and a metal silicate film.

8. The semiconductor device according to claim 7, wherein said metal oxide film is an oxide film including at least one metal selected from the group consisting of hafnium, zirconium, lanthanum, and yttrium.

9. The semiconductor device according to claim 7, wherein said metal silicate film is a silicate film including at least one metal selected from the group consisting of hafnium, zirconium, lanthanum, yttrium, and aluminum.

10. The semiconductor device according to claim 9, wherein said metal silicate film contains nitrogen.

11. A semiconductor device comprising:
    a first insulating film on a silicon substrate; and
    a second insulating film on said first insulating film, wherein
    said first insulating film is a silicon nitride film having a thickness not exceeding 1 nm and an oxygen content not exceeding 0.1 atom %; and
    said second insulating film is a high dielectric constant insulating film.

* * * * *

UNITED STATES PATENT AND TRADEMARK OFFICE
CERTIFICATE OF CORRECTION

PATENT NO. : 6,909,156 B2
DATED : June 21, 2005
INVENTOR(S) : Aoyama

It is certified that error appears in the above-identified patent and that said Letters Patent is hereby corrected as shown below:

<u>Title page,</u>
Item [73], Assignee, change "Abushiki" to -- Kabushiki --.

<u>Column 20,</u>
Line 27, change "lanthanum and" to -- lanthanum, and --.

Signed and Sealed this

Thirteenth Day of September, 2005

JON W. DUDAS
*Director of the United States Patent and Trademark Office*